United States Patent
Kokuyama

(10) Patent No.: US 10,270,633 B2
(45) Date of Patent: Apr. 23, 2019

(54) PHASE MEASURING DEVICE AND APPARATUSES USING THE PHASE MEASURING DEVICE

(71) Applicant: NATIONAL INSTITUTE OF ADVANCED INDUSTRIAL SCIENCE AND TECHNOLOGY, Tokyo (JP)

(72) Inventor: Wataru Kokuyama, Tsukuba (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 155 days.

(21) Appl. No.: 15/526,586

(22) PCT Filed: Nov. 13, 2015

(86) PCT No.: PCT/JP2015/081984
§ 371 (c)(1),
(2) Date: May 12, 2017

(87) PCT Pub. No.: WO2016/076419
PCT Pub. Date: May 19, 2016

(65) Prior Publication Data
US 2017/0324596 A1  Nov. 9, 2017

(30) Foreign Application Priority Data

Nov. 14, 2014 (JP) .................. 2014-231985

(51) Int. Cl.
G01B 9/02 (2006.01)
G01J 3/02 (2006.01)
(Continued)

(52) U.S. Cl.
CPC ........ H04L 27/2331 (2013.01); G01B 9/0201 (2013.01); G01J 3/021 (2013.01);
(Continued)

(58) Field of Classification Search
CPC .... G01J 3/45; G01J 3/021; G01J 3/028; G01J 3/4535; G01B 9/0201; G06F 17/14;
(Continued)

(56) References Cited

U.S. PATENT DOCUMENTS 5,001,724 A   3/1991  Birgenheier et al.
2007/0223634 A1  9/2007  Haddad et al.
(Continued)

FOREIGN PATENT DOCUMENTS

EP   0 378 405 A2   7/1990
JP   H02-227672 A   9/1990
(Continued)

OTHER PUBLICATIONS

International Search Report issued in PCT/JP2015/081984; dated Dec. 28, 2015.
(Continued)

*Primary Examiner* — Arnold M Kinkead
(74) *Attorney, Agent, or Firm* — Studebaker & Brackett PC

(57) ABSTRACT

The inventive phase measuring device includes a first A/D converter 2 that digitizes a first periodical input signal X at each predetermined sampling timing and outputs the resultant signal as a digital signal Xd, a first zero-crossing identification means operable to detect a sign of Xd, a counting processing unit 4 that counts a difference in the number of times of zero-crossing detection by the first zero-crossing identification means and calculates the difference at each sampling timing, and a fraction processing unit 5 that computes a fraction of the number of times of
(Continued)

zero-crossing detection on the basis of Xd at sampling timings immediately before and immediately after determination of zero-crossing by the first zero-crossing identification means. An averaging processing unit 6 performs averaging by adding up and totalizing the outputs from the counting processing unit 4 and the fraction processing unit 5, thereby computing a phase. The inventive device thus implements a digital phase measuring device and a digital phase difference measuring device that allow input of periodical signals in a wide frequency range and that are capable of accurate and real-time measurement.

7 Claims, 9 Drawing Sheets

(51) Int. Cl.
| | | |
|---|---|---|
| *G01J 3/45* | (2006.01) | |
| *G01S 7/40* | (2006.01) | |
| *H03D 3/02* | (2006.01) | |
| *H03K 5/26* | (2006.01) | |
| *G01J 3/453* | (2006.01) | |
| *G01R 27/28* | (2006.01) | |
| *G01S 13/34* | (2006.01) | |
| *G06F 17/14* | (2006.01) | |
| *H03L 7/085* | (2006.01) | |
| *H04L 27/233* | (2006.01) | |

(52) U.S. Cl.
CPC .............. *G01J 3/45* (2013.01); *G01J 3/4535* (2013.01); *G01R 27/28* (2013.01); *G01S 7/4008* (2013.01); *G01S 13/34* (2013.01); *G06F 17/14* (2013.01); *H03D 3/02* (2013.01); *H03K 5/26* (2013.01); *H03L 7/085* (2013.01)

(58) Field of Classification Search
CPC ....... H04L 27/2331; H03K 5/26; H03L 7/085; G01R 27/28; G01S 7/4008; G01S 13/34; H03D 3/02
USPC ............. 331/1 A; 250/339.07; 356/326, 477; 372/6; 375/376
See application file for complete search history.

(56) References Cited

U.S. PATENT DOCUMENTS

| | | | |
|---|---|---|---|
| 2010/0169730 A1 | 7/2010 | Kimura | |
| 2014/0022546 A1* | 1/2014 | Nagai ..................... | G01J 3/021 356/326 |

FOREIGN PATENT DOCUMENTS

| | | |
|---|---|---|
| JP | 2946675 B2 | 9/1999 |
| JP | 2007-232380 A | 9/2007 |
| JP | 2012-217121 A | 11/2012 |
| JP | 5468372 B2 | 4/2014 |

OTHER PUBLICATIONS

Written Opinion issued in PCT/JP2015/081984; dated Dec. 28, 2015.
International Preliminary Report on Patentability issued in PCT/JP2015/081984; dated May 16, 2017.

* cited by examiner

FIG. 1
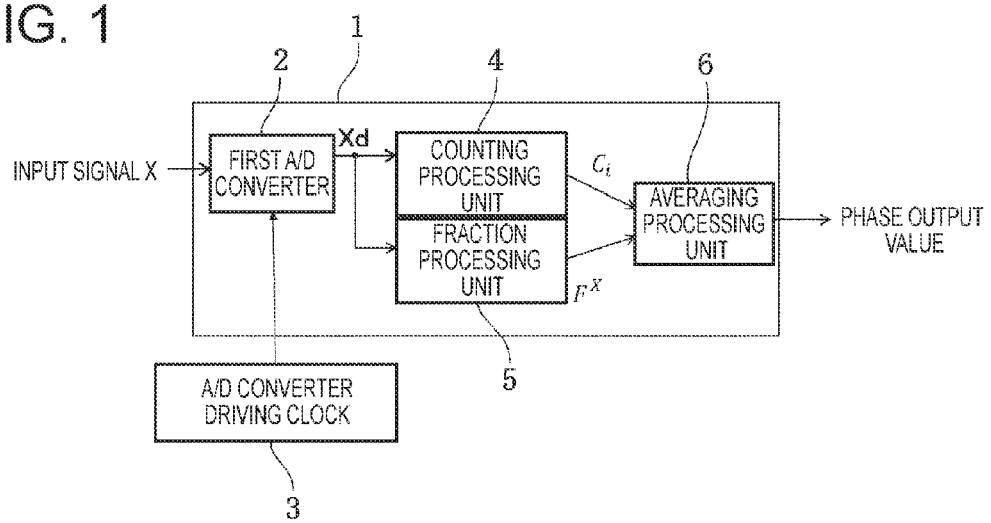
FIG. 2
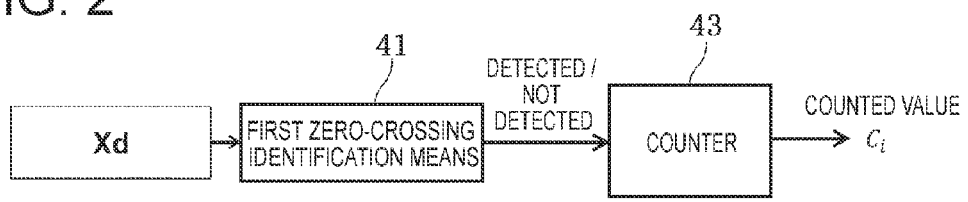
FIG. 3
(A)
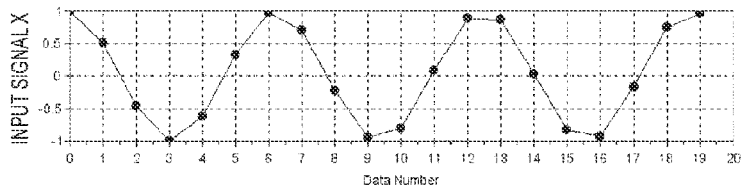
(B)
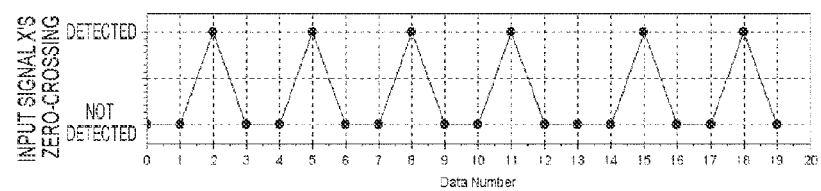
(C)
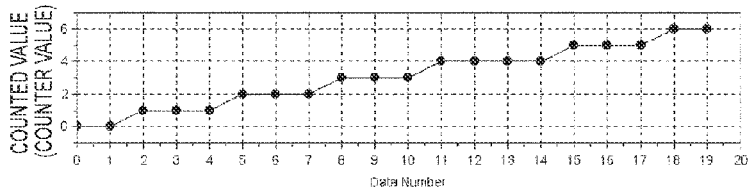

FIG. 7
(A) 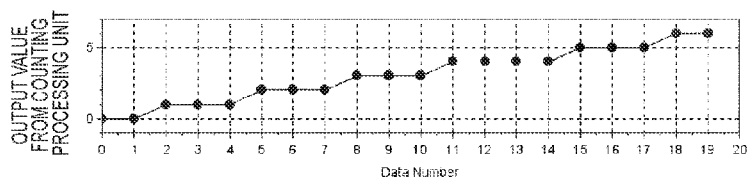
(B) 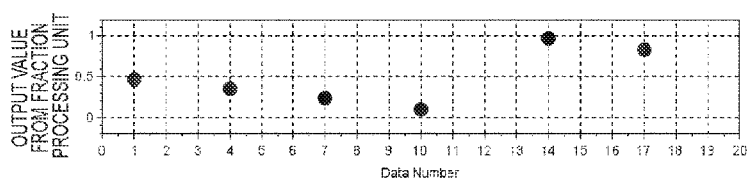
(C) 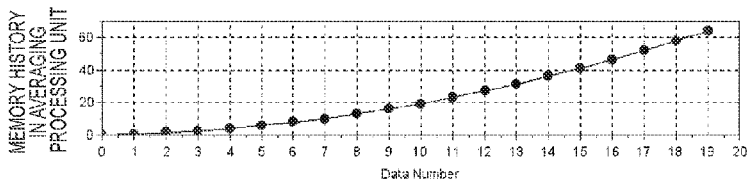
FIG. 8
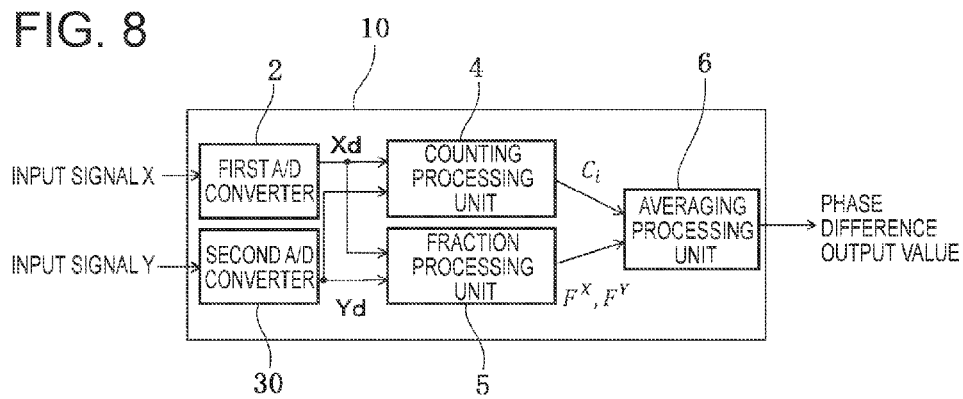
FIG. 9
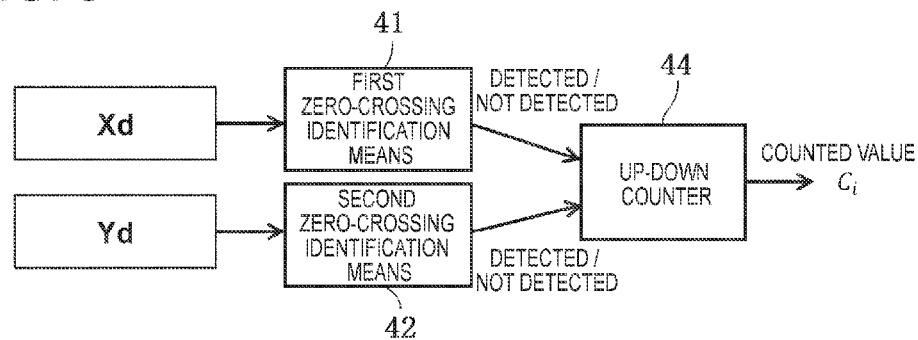

FIG. 14

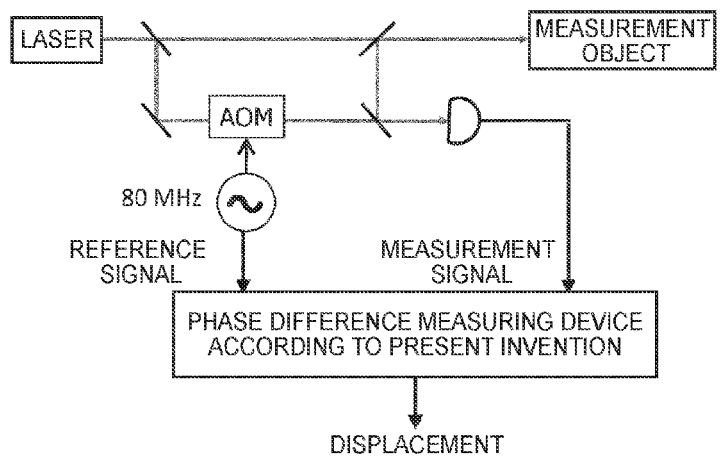

FIG. 15

| | DEMODULATION METHOD | COUNTING METHOD | ZERO-CROSSING ANALYSIS METHOD | PRESENT INVENTION |
|---|---|---|---|---|
| MEASUREMENT RESOLUTION | ○ GOOD | ▲ LIMITED (BECAUSE THE OUTPUT VALUE TAKES AN INTEGER VALUE) | ○ GOOD | ○ GOOD |
| VELOCITY RANGE OF MEASUREMENT OBJECT | ▲ NARROW (BECAUSE IT REQUIRES LOW-PASS FILTER) | ○ WIDE | ○ WIDE | ○ WIDE |
| REAL-TIME PROCESSING (WHETHER MEMORY IS NECESSARY) | ○ POSSIBLE | ○ POSSIBLE | ▲ NOT POSSIBLE (BECAUSE IT COMPUTES OR ESTIMATES ZERO-CROSSING TIME) | ○ POSSIBLE |
| REQUIRED CLOCK SPEED | ○ LOW | ▲ HIGH | ○ LOW | ○ LOW |
| PROCESSING COMPLEXITY | ▲ COMPLEX (IT REQUIRES LARGE NUMBER OF COMPUTATIONS INCLUDING MULTIPLICATION WITH REFERENCE SINE WAVE) | ○ SIMPLE | ▲ COMPLEX (IT REQUIRES LARGE NUMBER OF COMPUTATIONS FOR DERIVING AND ANALYZING ZERO-CROSSING TIME) | ○ SIMPLE |
| TOLERANCE TO AMPLITUDE VARIATION OF SIGNAL | ▲ POOR (IT IS AFFECTED BY AMPLITUDE VARIATION BECAUSE IT USES MEASUREMENTS OTHER THAN ZERO-CROSSING) | ○ STRONG | ○ STRONG | ○ STRONG |

PHASE MEASURING DEVICE AND APPARATUSES USING THE PHASE MEASURING DEVICE

TECHNICAL FIELD

The present invention relates to a phase measuring device which measures a phase of a periodically changing input signal (hereinafter, referred to as a periodical input signal), such as a sine wave, or a phase difference between periodical input signals by using a digital circuit, and to apparatuses using the phase measuring device.

BACKGROUND ART

A device that measures a phase or a phase difference of periodical input signals by using a digital circuit (hereinafter, referred to as a phase measuring device) is one of the most fundamental components in wireless communications, high-frequency signal processing, and high-accuracy frequency measurement. In particular, the phase information obtained by a phase measuring device can be differentiated by time to calculate a frequency, so the device is used as a frequency counter as well.

In wireless and wired communications, with an increase in speed and capacity of communications in recent years, phase noise in a reference signal source has become a factor that restricts the performance. Thus, in order to evaluate the reference signal source, a device that measures a time history of a phase of a periodical input signal (hereinafter, referred to as a phase noise measuring device) or the like has been used.

Further, a phase measuring device that measures a phase difference between two periodical input signals (hereinafter, such a device may also be referred to as a "phase difference measuring device") has wide applications as an element constituting a large number of measuring and/or controlling apparatuses.

For example, in a laser heterodyne displacement measuring device, a phase difference measuring device has been used for demodulating a displacement of a measurement object from an optically modulated signal.

In a power control system as well, periodically changing alternating current power, voltage, and current signals need to be measured, so a phase difference measuring device has been incorporated as part of the system. In particular, with the requirement for size reduction of the power control system, the phase difference measuring device is desired to have a simple configuration while maintaining a certain level of accuracy.

A phase-locked loop (hereinafter, referred to as a PLL circuit) is a circuit widely used in communication equipment and measuring devices. The PLL circuit has, as its internal element, a phase difference measuring device that measures a phase difference.

Some of physical quantity measurement sensors, such as an angular velocity detection sensor (also called a gyro sensor), have a PLL circuit incorporated therein, so it can be said that these sensors similarly include a phase difference measuring device portion.

In addition, a phase difference measuring device that measures a phase difference of digital pulse signals (signals with square waveforms) has widely been used primarily in communication equipment.

Such phase measuring devices and phase difference measuring devices have their measurement accuracy, resolution, dynamic range, and other performance affecting the ultimate system performance. Research and development have thus been conducted to improve both the performance and handiness of these measuring devices.

Recently, particularly from the convenience for interface with computers and for implementation, devices that use an A/D converter to convert an input signal into digital data and then measure a phase or phase difference through digital processing (hereinafter, referred to as digital phase measuring devices or digital phase difference measuring devices) have become available.

As a way of measuring a phase or phase difference of periodical input signals through digital data processing, several techniques have conventionally been known, which can be categorized broadly as a demodulation method, a counting method, or a zero-crossing method.

Firstly, the demodulation method will be described.

In the demodulation method, a reference signal is generated inside a circuit, and is multiplied with an input signal to detect a phase of the input signal. This processing can be performed on a periodical input signal to implement a phase measuring device.

With this method, although phase measurement is generally possible with high accuracy, demodulation becomes impossible when the input signal greatly differs in frequency from the reference signal. Further, the measurement accuracy would worsen when the input signal varies in amplitude or suffers distortion.

Besides this method of performing multiplication with a reference signal, there are a method of performing discrete Fourier transform, and a method of generating a quadrature signal by Hilbert transform and calculating a phase by arctangent calculation. These methods can also be categorized as the demodulation method and involve similar problems.

Next, the counting method is a technique known since a long time ago, in which the number of times a periodical signal crosses zero is counted using a counter and a phase is calculated from the counted value. Although it can be implemented with a very simple circuit configuration because of its principle, it can measure only a phase that is an integral multiple of the signal frequency, which poses a limitation in accuracy. Various modifications have thus been made to improve the accuracy of the counting method.

For example, a technique of disposing a PLL circuit in a preceding stage and multiplying the frequency of the periodical input signal before applying the counting method has been proposed. This technique makes it possible to amplify a small phase change in the input signal, to thereby improve the accuracy. The PLL circuit, however, has a limited response speed, so the measurement reliability decreases when the frequency of the periodical input signal varies severely (when the phase swings wildly).

Further, a method of combining a simple counting method with a counting method using a clock of higher frequency to improve the accuracy has been proposed as well. This however requires a high frequency clock, and also leads to a complicated circuit configuration and complex signal processing.

Furthermore, in order to correct a counted value that is always an integer value, there is a technique of calculating and correcting a fractional portion by performing linear interpolation before and after the zero-crossing point. Even if such correction is performed, the technique uses only the counted value at the end of a certain measurement time (also called a gate time), so there is a limit on the measurement resolution.

In the zero-crossing method, the time of the point (zero-crossing) when a periodical input signal has crossed zero is measured, and a phase of the signal is computed based on that time.

Specifically, making use of the fact that the time interval at which a signal crosses zero is proportional to the reciprocal of the frequency, the phase difference of the periodical input signal is calculated on the basis of the data accumulated in a memory.

With this method, however, among the data accumulated in the memory, data between adjacent two measurement points is used to estimate the phase, so the measurement time would be limited by the memory capacity.

Further, the time when the signal has crossed zero needs to be converted into a phase, so the signal processing and others increase the calculation load, making it difficult to implement real-time processing.

In order to enhance the performance of the phase measuring device, it is effective to combine a plurality of techniques so as to compensate for their shortcomings. In particular, combination of the counting method capable of addressing high-speed phase changes with the zero-crossing method capable of supporting highly accurate phase measurement is very effective, because it can configure a measuring device that satisfies both high-speed processing and a high degree of accuracy without the use of complicated digital processing as in the demodulation method.

From this standpoint, for example, Patent Document 1 discloses a phase difference measuring device applied to a laser heterodyne interferometer, wherein the counting method employing an up-down counter and the zero-crossing method using a triangular wave generated from an input signal are combined to detect a phase difference.

Further, Patent Document 2 discloses a phase-locked loop having a digital phase difference measuring unit used as part of the circuit, wherein an input signal is A/D-converted and then subjected to processing in a clock generating unit, a phase comparing unit, and a phase correcting unit, to thereby obtain a phase difference between the input sine wave signal and an internally held clock.

The principle of this phase difference measuring unit is that an input signal is initially digitized by the A/D converter to generate an input signal digital value. Next, the clock generating unit generates a "code clock" that expresses the positive or negative of the digital value of the input signal.

Next, in the phase comparing unit, the code clock is used to perform counting based on a high-speed "count clock" held inside. At the same time, in the phase correcting unit, linear interpolation is performed for the data before and after the zero-crossing point of the input signal digital value to calculate a phase correction value, and the output value from the phase comparing unit and the phase correction value are added up to thereby obtain a desired phase difference.

Patent Document 3 discloses, as a phase error (synonymous with the phase difference as used herein) detecting device, a method of A/D-converting an input signal and detecting and correcting a phase error. Detection of a phase error is implemented by: an equalization unit having a predetermined equalization characteristic; a binarization unit that binarizes the signal output from the equalization unit; and an arithmetic unit that calculates a desired phase error signal, by metric computation, from the outputs from the equalization unit and the binarization unit. For implementing the correction, it is determined whether the past phase error history falls within a predetermined range and, when an error out of the range has been detected, correction is performed to cause the error to fall within that range.

Patent Document 4 discloses a frequency measuring method and apparatus, in which amplitude values before and after the zero-crossing point of a periodical input signal are subjected to interpolation, to sequentially calculate the times of the zero-crossing points, and the frequency of the periodical input signal is calculated from the reciprocal of the difference of the times of the zero-crossing points. This method is also included in the "zero-crossing method".

CITATION LIST

Patent Documents

Patent Document 1: JP2946675
Patent Document 2: JP2012-217121A
Patent Document 3: JP5468372
Patent Document 4: JP2007-232380A

SUMMARY

Technical Problem

In the technique disclosed in Patent Document 1, however, an analog triangular wave signal is generated inside the device, which requires a highly accurate analog circuit. This poses a problem that the changes in noise and in characteristics of the analog portion make the performance unstable.

Further, in the technique disclosed in Patent Document 2, a plurality of clocks, i.e. the sampling clock and the count clock, are used inside, leading to a complicated circuit configuration. In addition, for example in the case where the input sine wave signal suffers considerable phase fluctuation, the counted value in the phase comparing unit may not accurately reflect the phase difference. Further, although the calculated value of the phase difference between the input sine wave signal and the internally held clock is corrected in the phase correcting unit, its resolution is restricted to the resolution of the A/D conversion itself. Furthermore, the measurement is conducted using only the phase at the last moment of one period of the input sine wave signal. This poses another problem that it is not possible to eliminate the effect of the phase fluctuation earlier than the period of the input sine wave signal, which would be included as aliasing in the measurement result.

In the technique disclosed in Patent Document 3, the calculated phase difference is corrected by adding thereto a value of an integral multiple of ±360°, and adjusted such that the resultant value becomes a value within ±180°. This poses a problem that the resultant value may not reflect the true value of the phase difference in the case, for example, where the actual phase difference has exceeded ±180°.

Further, the techniques disclosed in Patent Documents 2 and 3 are each aimed at measuring a phase difference between a single input sine wave signal and an internally held reference clock. They cannot measure a phase for a periodical input signal the frequency of which varies a lot.

While Patent Document 4 describes the use of DSP for real-time computation, the frequencies that can be computed in real time are restricted by the calculation speed of the DSP. This places a limit on the measurable frequencies of the periodical input signals. Further, the document is directed to computation of a frequency; it is not intended to calculate a phase of a periodical input signal, so in case a phase is calculated, it will have a large error.

Further, in each of the techniques disclosed in Patent Documents 2 to 4, the frequency or phase is calculated from the time of one period of an input signal. The measurement value is output at each period of the input signal. Thus, in the case where the frequency of the input signal varies significantly, the time intervals at which the measurement values are calculated will considerably vary depending on the input signal.

Particularly in the digital signal processing in which a steady clock is used for signal processing, this will cause an increased load in the processing in the subsequent stage(s), a response delay, and a complicated circuit configuration. It is desirable that the results are calculated at equal time intervals even if the frequency of the input signal varies considerably.

In view of the foregoing, an object of the present invention is to provide a digital phase measuring device that calculates a phase with simpler processing from an input signal digital value obtained by an A/D converter, to thereby allow input of periodical signals in a wide frequency range and also enable measurement of phase or phase difference with high accuracy, at equal time intervals, and in real time.

Solution to Problem

In order to implement a simple and robust phase measurement with high accuracy, the present invention applies the counting method and the zero-crossing method to a periodical input signal, and adds up and totalizes the results (this is called averaging processing).

Specifically, a phase measuring device according to the present invention is a phase measuring device which measures a phase of a periodical input signal that changes periodically or a phase difference between periodical input signals by using a digital circuit, wherein the device includes:

an A/D converter that digitizes the periodical input signal respectively at each predetermined sampling timing and outputs each resultant signal as a digital signal; a zero-crossing identification means operable to detect a change in sign of the digital signal; a counting processing unit that counts the number of times of zero-crossing detection by the zero-crossing identification means and calculates the number at each sampling timing; a fraction processing unit that computes a fraction $F^x$ of the number of times of zero-crossing detection, on the basis of the digital signal at sampling timings immediately before and immediately after determination of zero-crossing by the zero-crossing identification means; and an averaging processing unit that performs averaging on the basis of a sum of N output values calculated by the counting processing unit and a sum of the fractions $F^x$ computed by the fraction processing unit during a corresponding period, to compute a phase of the digital signal.

Further, in the phase difference measuring device which measures a phase difference according to the present invention, the periodical input signal includes the first periodical input signal X and a second periodical input signal Y, the A/D converter includes first and second A/D converters that digitize the periodical input signals X and Y, respectively, at each predetermined sampling timing and output the resultant signals as digital signals Xd and Yd, respectively, the zero-crossing identification means includes first and second zero-crossing identification means operable to detect changes in sign of the digital signals Xd and Yd, respectively, the counting processing unit counts a difference between the number of times of zero-crossing detection by the first zero-crossing identification means and the number of times of zero-crossing detection by the second zero-crossing identification means and calculates the difference at each sampling timing, the fraction processing unit computes fractions $F^x$ and $F^y$ of the respective numbers of times of zero-crossing detection by the first and second zero-crossing identification means, on the basis of the digital signals Xd and Yd at sampling timings immediately before and immediately after determination of zero-crossing by the corresponding ones of the first and second zero-crossing identification means, and the averaging processing unit performs averaging on the basis of a sum of N output values calculated by the counting processing unit and a difference between a sum of the fractions $F^x$ and a sum of the fractions $F^y$ computed by the fraction processing unit during a corresponding period, to compute a phase difference between the digital signals Xd and Yd, thereby measuring a phase difference between the periodical input signals X and Y.

Advantageous Effects of Invention

Here, when the frequency of the input signal is represented as $f_{IN}$, the sampling rate for driving the A/D converter as $f_{ADC}$, the number of conversion bits of the A/D converter as n, and the number of averaging as N, the present invention can eventually achieve a phase calculating rate of $f_{ADC}/N$ by the averaging processing.

This produces advantageous effects as follows.

(1) Wide Input Signal Frequency Range

With the present invention applied, measurement becomes possible even in the case where the input signal has a wide frequency band. Specifically, measurement is sufficiently possible in the range of $f_{IN}<f_{ADC}/4$.

(2) High Resolution

When the phase resolution is represented as d (in radian), according to the present invention, it is possible to increase the resolution of phase measurement, with the relationship of $d=2\pi/(N \cdot 2^n)$.

(3) Real-Time Processing

It is possible to process a signal in real time to calculate the phase successively over a long time. For example, when an FPGA is implemented, a desired phase can be obtained successively at the rate of $f_{ADC}/N$, without a time delay.

The above advantageous effects are also obtained in the case where a phase difference is measured using the phase measuring device of the present invention.

BRIEF DESCRIPTION OF DRAWINGS

FIG. 1 is a diagram illustrating a general outline of signal processing in a phase measuring device of the present invention.

FIG. 2 is a block diagram of a counting processing unit according to the present invention.

FIG. 3 is a diagram illustrating an operation of the counting processing unit according to the present invention.

FIG. 7 is a diagram illustrating an operation until averaging processing is performed.

FIG. 8 is a diagram illustrating a general outline of signal processing in a phase difference measuring device of the present invention.

FIG. 9 is a block diagram of a counting processing unit in the phase difference measuring device of the present invention.

FIG. 14 is a diagram illustrating a general outline of Example 1 as an application to a laser heterodyne interferometer.

FIG. 15 is a diagram listing advantages of Example 1 as compared to the conventional techniques.

DESCRIPTION OF EMBODIMENTS

Figure 4:
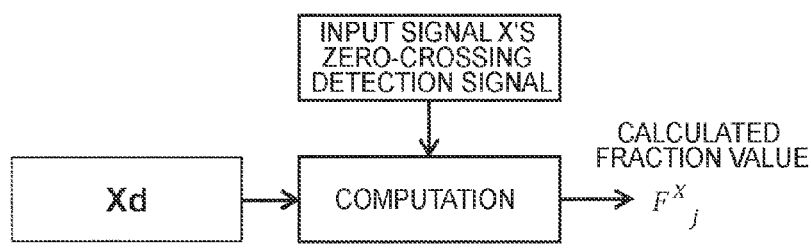
FIG. 4 is a block diagram of a fraction processing unit according to the present invention.

Firstly, the basic principles of the phase measuring device based on the present invention will be described with reference to the drawings.

A periodical input signal in the phase measuring device will be hereinafter referred to as an input signal X.

The general outline of signal processing performed by the phase measuring device 1 based on the present invention is shown in FIG. 1.

The input signal X is digitized by a first A/D converter 2, and output as Xd. A driving clock 3, which is for driving the A/D converter 2, is input into the A/D converter 2.

The converted, digital data Xd is transmitted to a subsequent digital signal processing section, where the data is processed. As shown in FIG. 1, the digital signal processing section is made up of three units of a counting processing unit 4, a fraction processing unit 5, and an averaging processing unit 6.

The functions of the three units of the counting processing unit 4, the fraction processing unit 5, and the averaging processing unit 6 will now be described in order.

(Counting Processing Unit)

FIG. 2 is a block diagram of the counting processing unit 4.

The operation will be described in detail with reference to FIG. 3.

Here, the horizontal axis represents the data number i at each sampling timing. Specifically, from the left in order (starting at i=0), data are received successively at a driving sampling rate of the first A/D converter 2, and subjected to processing. That is, the data interval in FIG. 3 corresponds to the driving sampling rate of the first A/D converter 2 (or, period of the driving clock 3).

Firstly, data Xd, obtained by digitizing the input signal X by the first A/D converter 2, corresponds to (A) in FIG. 3.

Here, the counting processing unit 4 uses a first zero-crossing identification means 41 to detect zero-crossing when the data Xd is switched from positive to negative or vice versa. For example, when a timing at which the data has crossed zero is detected in (A) in FIG. 3, a signal in FIG. 3 (B) is made to rise to take a positive logic immediately after the zero-crossing, at the data number corresponding to the time point when the data has passed zero. In this manner, zero-crossing can be detected.

Next, the signal shown in FIG. 3 (B) is input into a counter 43, where counting processing is performed.

The counter 43 counts up each time a detection signal is received from the first zero-crossing identification means 41. The value held by the counter 43 is as shown in FIG. 3 (C).

It should be noted that in the case where the input signal X has a frequency much smaller than the driving sampling rate of the first A/D converter 2, noise included in the input signal or in the first A/D converter 2 itself may cause misdetection of zero-crossing. Even in such a case, there is no problem because the misdetection can be ignored using a well-known algorithm.

(Fraction Processing Unit)

Next, the general outline of the fraction processing unit 5 is shown in FIG. 4.

The operation of the fraction processing unit 5 will now be described in detail with reference to FIGS. 5 and 6.

Figure 5:
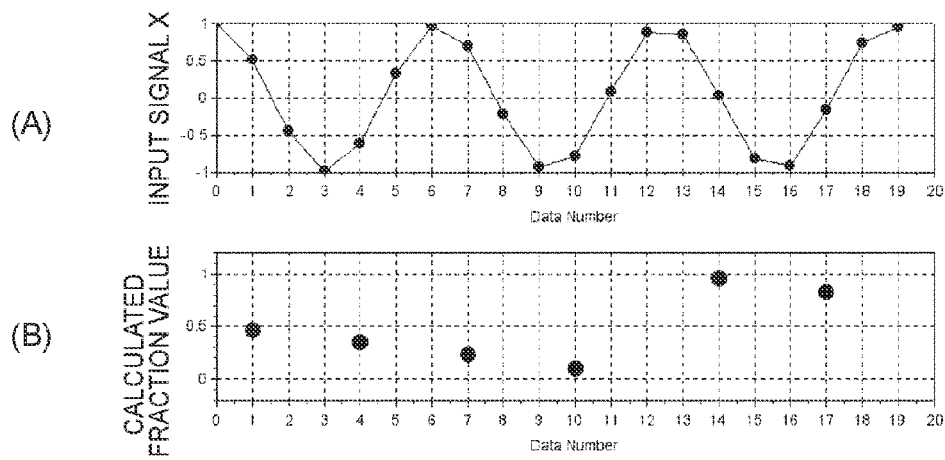
FIG. 5 is a diagram illustrating an operation of the fraction processing unit according to the present invention.
Figure 6:
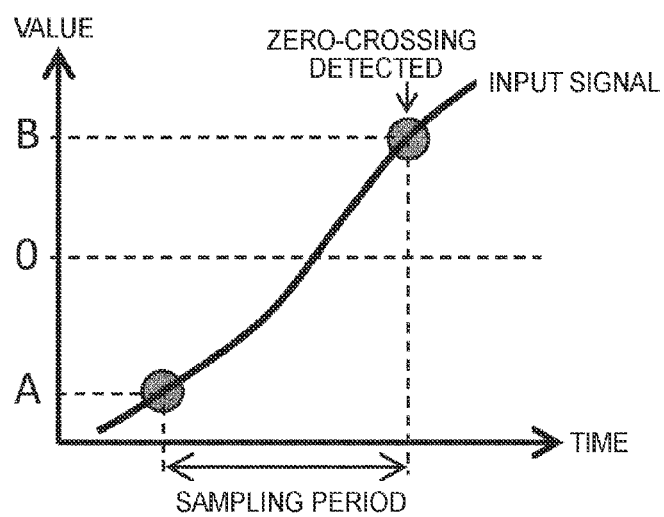
FIG. 6 is a diagram illustrating a relationship between an input signal and zero-crossing detection.

Firstly, the digital data row Xd, obtained by converting the input signal X by the first A/D converter 2, corresponds to FIG. 5 (A), which is precisely the same as FIG. 3 (A).

Next, linear interpolation computation processing is carried out. Specifically, a value (value B in FIG. 6) at the timing when zero-crossing of a measurement signal has been detected and a value (value A in FIG. 6) immediately before it are latched.

From these two data pieces, a linear interpolation computation as expressed by the expression 1 is performed.

$$|B|/(|A|+|B|) \qquad \text{(Expression 1)}$$

The calculated value is held, in association with the timing immediately before the zero-crossing detection timing (i.e. the same timing as the value A in FIG. 6), as a calculated fraction value. This is illustrated in FIG. 5 (B).

In FIG. 5 (B), as zero-crossing has been detected for example at the data number 2 (see FIG. 3 (B)), the value at the data number 1 and the value at the data number 2 are used to perform the calculation of the expression 1 to obtain a calculated value (of approximately 0.5), which value is then associated with the time point of the data number 1. Similarly, the calculated fraction values are obtained at the time points of the data numbers 4, 7, 10, 14, and 17.

In this operation of the fraction processing unit 5, zero-crossing of the input signal X itself should be detected. The zero-crossing detection operation may be performed in the fraction processing unit 5 as independent zero-crossing detection processing. Alternatively, the operation may be implemented by transmitting a detection signal from the outside of the fraction processing unit 5, for example from the counting processing unit 4.

While this processing includes a division, generally in an FPGA, high-speed floating-point arithmetic (division) places heavy load. To reduce such load, a division using a "look-up table" may be applied.

A division using a look-up table is a technique known in the arithmetic operations by the FPGA. Specifically, for S of every value that the data can take (256 values in the case of 8 bits, for example), "×T" approximately equivalent to "÷S" is held in advance as a table (dictionary) in an internal memory. When a certain division "÷S" is to be done in the FPGA, the corresponding "×T" is extracted to do a multiplication instead, which is simpler than the division.

When a division using a look-up table is applied, the calculated fraction value will include an error from the exact value obtained from the expression 1. The calculated fraction value, however, corresponds to the correction term of the final result, which barely affects the final result. Therefore, such a replacement will not lead to deteriorated measurement accuracy.

(Averaging Processing Unit)

The operation of the averaging processing unit 6 will now be described.

The averaging processing unit 6 uses two data rows obtained from the counting processing unit 4 and the fraction processing unit 5 to perform arithmetic processing on the basis of the following expression 2.

$$U = \frac{1}{N}\left(\sum_{i=0}^{N-1} C_i + \sum_{j=1}^{i} F_j^X\right)$$ [Expression 2]

Firstly, the number N of averaging is determined from a rate at which data is desired to be obtained ultimately. That is, 1/N of the sampling rate of the A/D converter operation becomes the sampling rate at which the output data is obtained ultimately.

By way of example, N=20 hereinbelow, as shown in FIG. 7. That is, the number of the output values from the counting processing unit 4 and the fraction processing unit 5 that the averaging processing unit 6 uses per averaging processing is 20, with the data numbers i from 0 to 19.

The symbols in the expression 2 are defined as follows.

$C_i$: an output value from the counting processing unit 4 (i.e. a value of the counter 43; see FIG. 7 (A)).

$F_j^X$: a calculated fraction value, calculated for the input signal X by the fraction processing unit 5 (FIG. 7 (B)). Here, j is the number attached to indicate the order of each output value. In the example shown in FIG. 7 (B), six points are plotted over the data numbers from 0 to 19, so j=1-6. That is, I=6 in the expression 2.

As explained above, in the example in FIG. 7, the addition/subtraction and division by N indicated by the expression 2 are performed with 20 pieces of $C_i$ and 6 pieces of $F_j^X$, to obtain an output value U from the averaging processing unit 6.

In the case where the above-described averaging processing is actually implemented in an FPGA, in order to ensure real-time performance, the processing may be performed in the following manner.

(1) At the timing corresponding to each data number, data pieces of $C_i$, $F_j^X$, $F_k^Y$ output from the counting processing unit 4 and the fraction processing unit 5 are transmitted to the averaging processing unit 6.

(2) The averaging processing unit 6 holds a value in its memory (with the initial value being zero), and at each timing, it adds the received data to the value held in the memory, and holds the resultant value until the next data reception timing. That is, a value $S_i$ held in the memory is according to the recurrence formula in the expression 3.

$$S_i = S_{i-1} + C_i + F^X$$ (Expression 3)

It should be noted that $F^X$ is used in the computation only when the value has been transmitted. At this time, the history of $S_i$ is as shown in FIG. 7 (C).

(3) Here, in the fraction processing unit 5, the calculated fraction value is associated with the timing immediately before the zero-crossing detection timing, as explained above. The calculated fraction value can be obtained only after the zero-crossing detection timing, so the timing needs to be adjusted.

To this end, a delay for M timings may be inserted before the addition/subtraction is performed in the averaging processing unit 6. M is an appropriate integer not smaller than 1 and sufficiently smaller than N.

With the delay inserted, the processing in (2) above can be performed after the calculation of the calculated fraction value $F^X_j$, at the expense of the delay for M timings of the value held in the memory.

The time delay for M timings, however, poses no problem because it is sufficiently smaller than the above-described sampling rate at which the output data will be obtained ultimately.

The time delay of course takes a known fixed value constantly. It is thus possible to compensate for the delay when accuracy in measurement time is desired.

(4) The addition/subtraction is repeated as in (2) above.

(5) With the processing in (4) continued, once the last data has been received, the value held at the time point corresponding to i=19 (last) is divided by N to obtain the value in the expression 2. Therefore, this value may be used as the ultimate output. After completion of this series of operations, the value held is reset to zero before starting the next series of operations.

Further, in the case where it is necessary to reduce the load of the division part of dividing with N, a power of two may be selected as N.

The output U from the averaging processing unit 6 and a desired phase φ (in radian) have a relationship expressed by the following expression 4.

$$\phi = \pi U$$ (Expression 4)

More precisely, a constant ε is added to the right side of the expression 4. Theoretically, ε is a value that takes a value of π or zero, which is uniformly determined in accordance with the phase relationship of the input signal at the start of measurement.

In the case where phase measurement is performed successively, as in the phase measuring device of the present invention or in an apparatus using the device, the change in phase becomes a major parameter to be measured, so ε is a term that is ignorable and poses no problem on the measurement. That is, when the value of U calculated firstly after the start of measurement is represented as $U_0$ and the subsequent value of U is represented as Un (n=1, 2, . . . ), $U_n - U_0$ is used as a measurement result. Thus, the presence of ε, which is added to both, poses no problem.

Here, φ is a phase (in radian) of the input signal X. The phase is measured with respect to the time point when the processing was started. When the output U is processed inside the FPGA or on the PC on the basis of this relationship, the phase (in radian) can be calculated.

In consideration of the processing in subsequent stages, it is of course possible to use the data U, as it is, in the processing in the subsequent stages, without converting it into a phase (in radian) as in the expression 4.

A measurement instrument that computes and outputs a result in real time is required to have a function of setting a time as a basis for starting measurement. That is, it is desired to have a function of setting a phase φ to zero at the time when a certain reset signal has been received during the operation, and computing the subsequent output data on the basis of that reference time. This function can readily be implemented by an operation of resetting the value of the counter in the counting processing unit to zero and/or initializing the processing in the averaging processing unit at the timing of reception of a reset signal.

Calculating a phase according to the processing as described above makes it possible to input a periodical signal in a wide frequency range, and to perform measurement with accuracy and in real time.

While the example of implementing the digital signal processing by an FPGA has been illustrated above, not only the FPGA, but also an ASIC, a system LSI, or any other method capable of realizing digital signal processing can implement the processing in a similar manner.

Further, while the input signal X has been assumed to be a sine wave signal, a pulse signal (also called a square wave signal) used in digital circuits can be converted into a sine wave signal by applying a band-pass filter or low-pass filter.

It is therefore possible to compose a phase measuring device for a pulse signal by disposing a band-pass filter in a stage preceding the phase measuring device.

Further, the calculated phase can be differentiated by time in processing in a subsequent stage, to convert it into a frequency of the input signal X. As such, even in the case where the device is used as a frequency counter, it can measure the frequency of a signal having a wide frequency variation range, while ensuring high resolution and real-time property. Supporting a wide frequency variation range can be stated differently that even for an input signal having large frequency noise, high-speed and reliable measurement is possible.

Next, the basic principles in the case of measuring a phase difference on the basis of the present invention, i.e. in the case of using the device as a phase difference measuring device, will be described with reference to the drawings.

Two periodical input signals for use in phase difference measurement will be hereinafter referred to as input signals X, Y. It should be noted that the elements and components common to those in the phase measuring device described above will be denoted by the same reference characters.

The general outline of signal processing performed by the phase difference measuring device 10 based on the present invention is shown in FIG. 8.

An input signal X and an input signal Y are digitized separately by a first A/D converter 2 and a second A/D converter 30, and output as Xd and Yd, respectively. The converted, digital data Xd, Yd are transmitted to a subsequent digital signal processing section, where the data are processed. As shown in FIG. 8, the digital signal processing section is made up of three units of a counting processing unit 4, a fraction processing unit 5, and an averaging processing unit 6.

The functions of the three units of the counting processing unit 4, the fraction processing unit 5, and the averaging processing unit 6 will now be described in order.

(Counting Processing Unit)

FIG. 9 is a block diagram of the counting processing unit 4.

The operation will be described in detail with reference to FIG. 10.

Here, the horizontal axis represents the data number i at each sampling timing. Specifically, from the left in order (starting at i=0), data are received successively at a driving sampling rate of the first A/D converter 2 and of the second A/D converter 30, and subjected to processing. That is, the data interval in FIG. 10 corresponds to the driving sampling rate of each A/D converter 2, 30.

Figure 10:
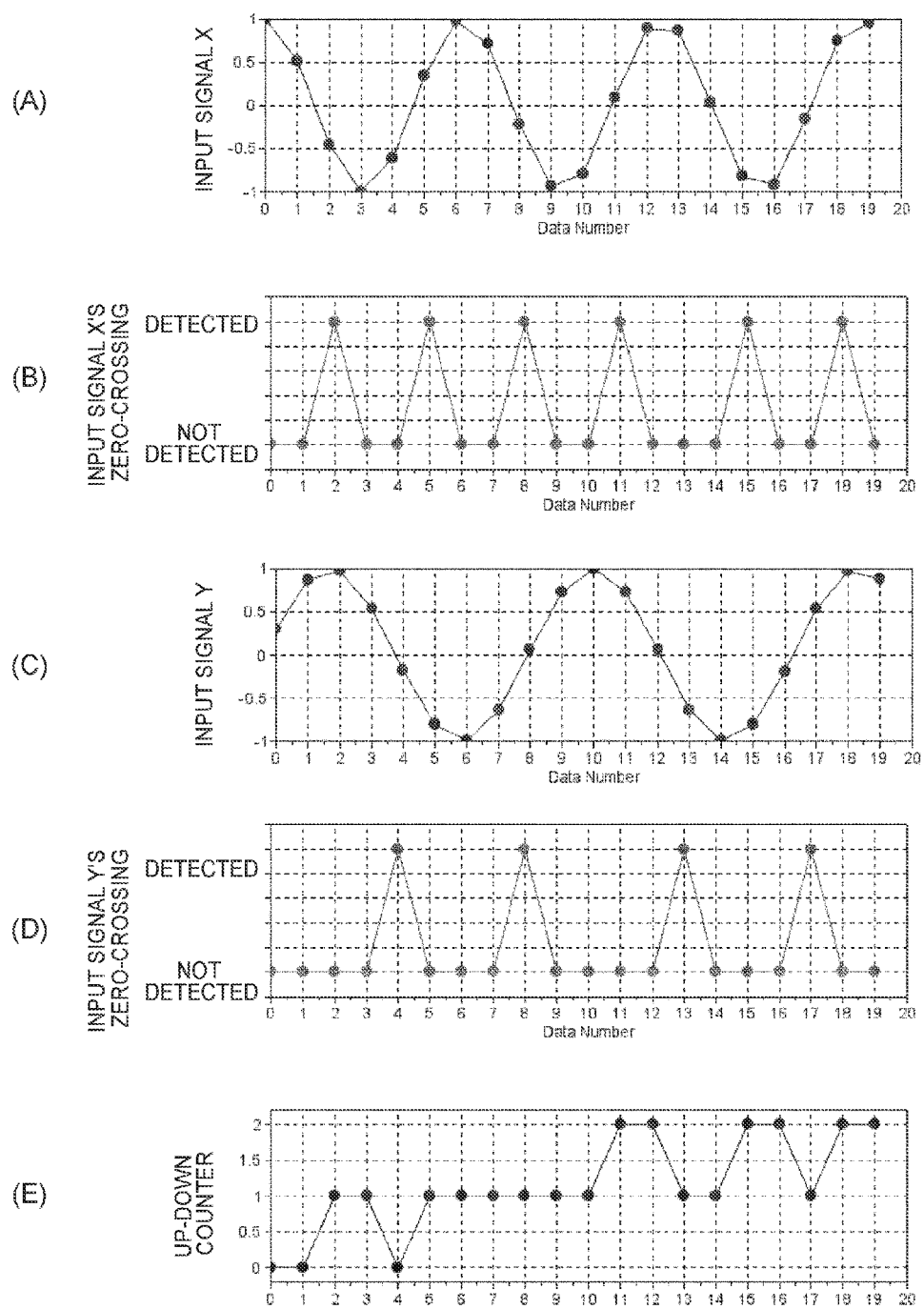
FIG. 10 is a diagram illustrating an operation of the counting processing unit in the phase difference measuring device of the present invention.

Firstly, data Xd and Yd, obtained by digitizing the input signal X and the input signal Y by the first A/D converter 2 and the second A/D converter 30, correspond respectively to (A) and (C) in FIG. 10.

Here, the counting processing unit 4 uses a first zero-crossing identification means 41 to detect zero-crossing when the data Xd is switched from positive to negative or vice versa. For example, when a timing at which the data has crossed zero is detected in (A) in FIG. 10, a signal in FIG. 10 (B) is made to rise to take a positive logic immediately after the zero-crossing, at the data number corresponding to the time point when the data has passed zero. In this manner, zero-crossing can be detected.

Similarly, a second zero-crossing identification means 42 is used to perform zero-crossing processing on the data Yd. The signal obtained as a result is as shown in FIG. 10 (D).

Next, the signal shown in FIG. 10 (B) and the signal shown in FIG. 10 (D) are input into an up-down counter 44, where counting processing is performed.

For the up-down counter 44, a well-known counter is adopted which has a function of counting "1" when a detection signal is received from the first zero-crossing identification means 41, counting "−1" when a detection signal is received from the second zero-crossing identification means 42, and otherwise maintaining the value unchanged. It should be noted that the counting directions (positive and negative) may be set arbitrarily, because even when the positive and negative are set oppositely, they may be reversed in subsequent processing to obtain the same results.

The value held by the up-down counter 44 is as shown in FIG. 10 (E). This data row in FIG. 10 (E) is transmitted to the averaging processing unit 6 as counted values. This data row corresponds to $C_i$ (where i is the data number) in the expression 6 described later.

It should be noted that in the case where the input signals each have a frequency much smaller than the driving sampling rate of the corresponding A/D converter 2, 30, noise included in the input signal or in the A/D converter 2, 30 itself may cause misdetection of zero-crossing. Even in such a case, there is no problem because the misdetection can be ignored using a well-known algorithm, as in the case where the phase itself is measured as described earlier.

(Fraction Processing Unit)

Figure 11:
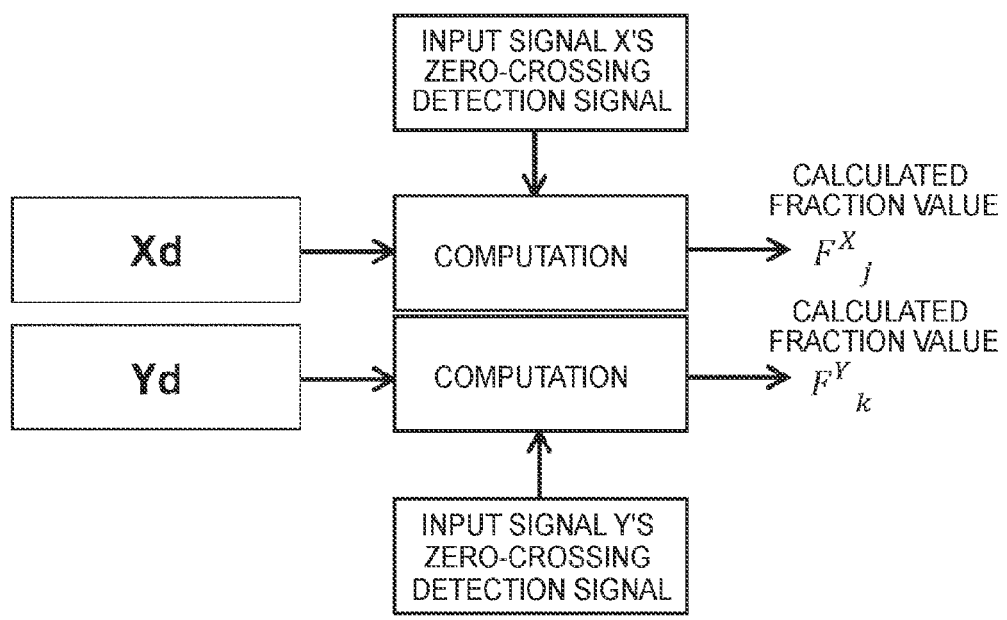
FIG. 11 is a block diagram of a fraction processing unit in the phase difference measuring device of the present invention.

Next, the general outline of the fraction processing unit 5 is shown in FIG. 11.

The operation of the fraction processing unit 5 will now be described in detail with reference to FIGS. 6 and 12.

Figure 12:
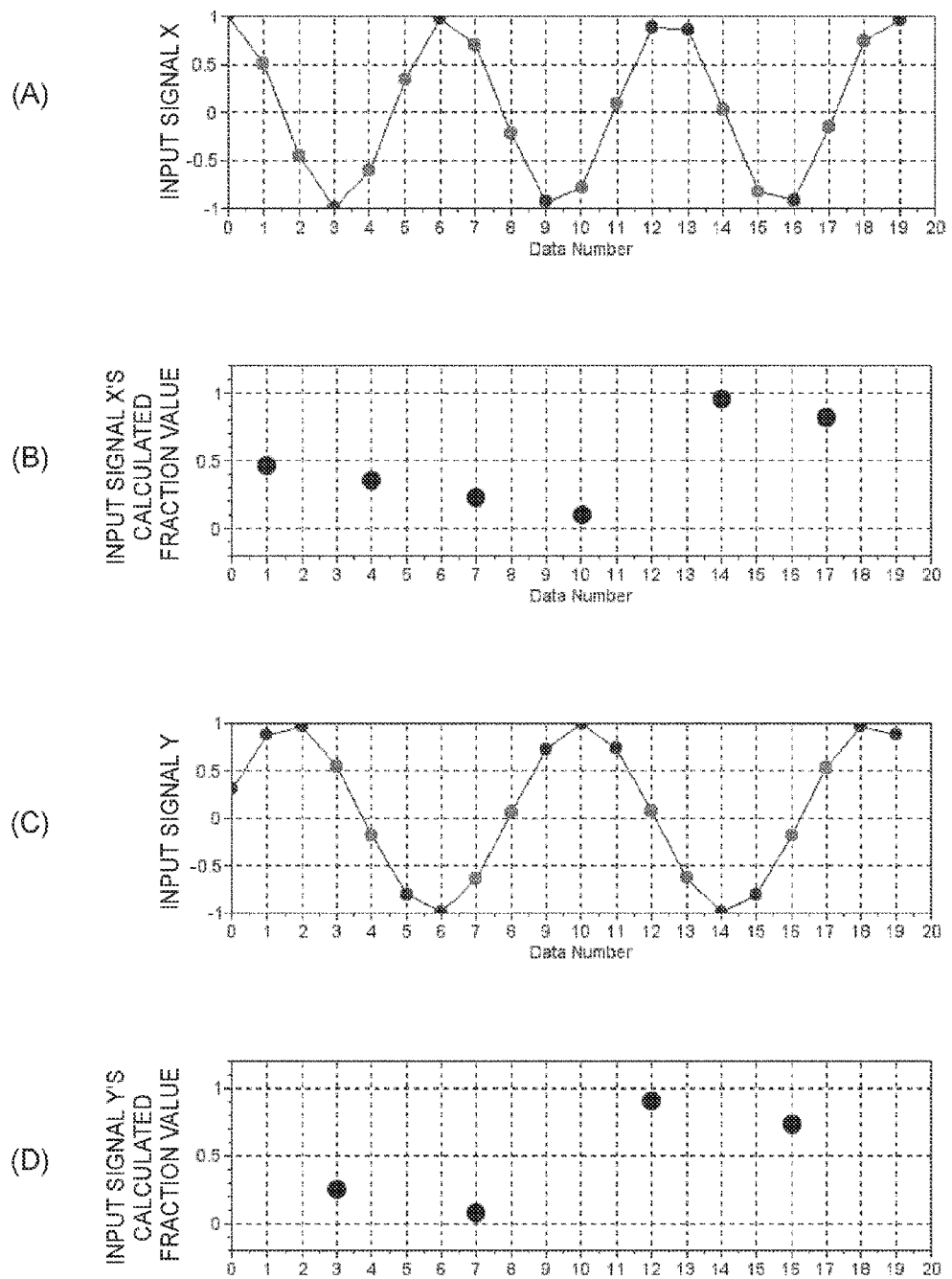
FIG. 12 is a diagram illustrating an operation performed by the fraction processing unit in the phase difference measuring device of the present invention.

Firstly, the digital data row Xd, obtained by converting the input signal X by the first A/D converter 2, corresponds to FIG. 12 (A), which is precisely the same as FIG. 10 (A).

Next, linear interpolation computation processing is carried out. Specifically, a value (value B in FIG. 6) at the timing when zero-crossing of a measurement signal has been detected and a value (value A in FIG. 6) immediately before it are latched. From these two data pieces, a linear interpolation computation as expressed by the expression 5 is performed.

$$|B|/(|A|+|B|) \quad \text{(Expression 5)}$$

The calculated value is held, in association with the timing immediately before the zero-crossing detection timing (i.e. the same timing as the value A in FIG. 6), as a calculated fraction value. This is illustrated in FIG. 12 (B).

In FIG. 12 (B), as zero-crossing has been detected for example at the data number 2 (see FIG. 10 (B)), the value at the data number 1 and the value at the data number 2 are used to perform the calculation of the expression 5 to obtain a calculated value (of approximately 0.5), which value is then associated with the time point of the data number 1. Similarly, the calculated fraction values are obtained at the time points of the data numbers 4, 7, 10, 14, and 17.

In this operation of the fraction processing unit 5, zero-crossing of each of the input signal X and the input signal Y themselves should be detected. The zero-crossing detection operation may be performed in the fraction processing unit 5 as independent zero-crossing detection processing. Alternatively, the operation may be implemented by transmitting a detection signal from the outside of the fraction processing unit 5, for example from the counting processing unit 4.

While this processing includes a division, generally in an FPGA, high-speed floating-point arithmetic (division) places heavy load. To reduce such load, a division using a "look-up table" may be applied.

A division using a look-up table is a technique known in the arithmetic operations by the FPGA. Specifically, for S of every value that the data can take (256 values in the case of 8 bits, for example), "×T" approximately equivalent to "÷S" is held in advance as a table (dictionary) in an internal memory. When a certain division "÷S" is to be done in the FPGA, the corresponding "×T" is extracted to do a multiplication instead, which is simpler than the division.

When a division using a look-up table is applied, the calculated fraction value will include an error from the exact value obtained from the expression 5. The calculated fraction value, however, corresponds to the correction term of the final result, which barely affects the final result. Therefore, such a replacement will not lead to deteriorated measurement accuracy.

For the input signal Y as well, the calculated fraction value is obtained in exactly the same manner as in the input signal X. The input signal Y is shown in FIG. 12 (C), and the calculated fraction values obtained are shown in FIG. 12 (D).

(Averaging Processing Unit)

The operation of the averaging processing unit 6 will now be described.

The averaging processing unit 6 uses two data rows obtained from the counting processing unit 4 and the fraction processing unit 5 to perform arithmetic processing on the basis of the following expression 6.

[Expression 6]

$$U = \frac{1}{N}\left(\sum_{i=0}^{N-1} C_i + \sum_{j=1}^{i} F_j^X - \sum_{k=1}^{m} F_k^Y\right)$$ [Expression 6]

Firstly, the number N of averaging is determined from a rate at which data is desired to be obtained ultimately. That is, 1/N of the sampling rate of the A/D converter operation becomes the sampling rate at which the output data is obtained ultimately.

By way of example, N=20 hereinbelow. That is, the number of the data pieces that the averaging processing unit 6 uses per averaging processing is 20, with the data numbers i from 0 to 19.

The symbols in the expression 6 are defined as follows.

Figure 13:
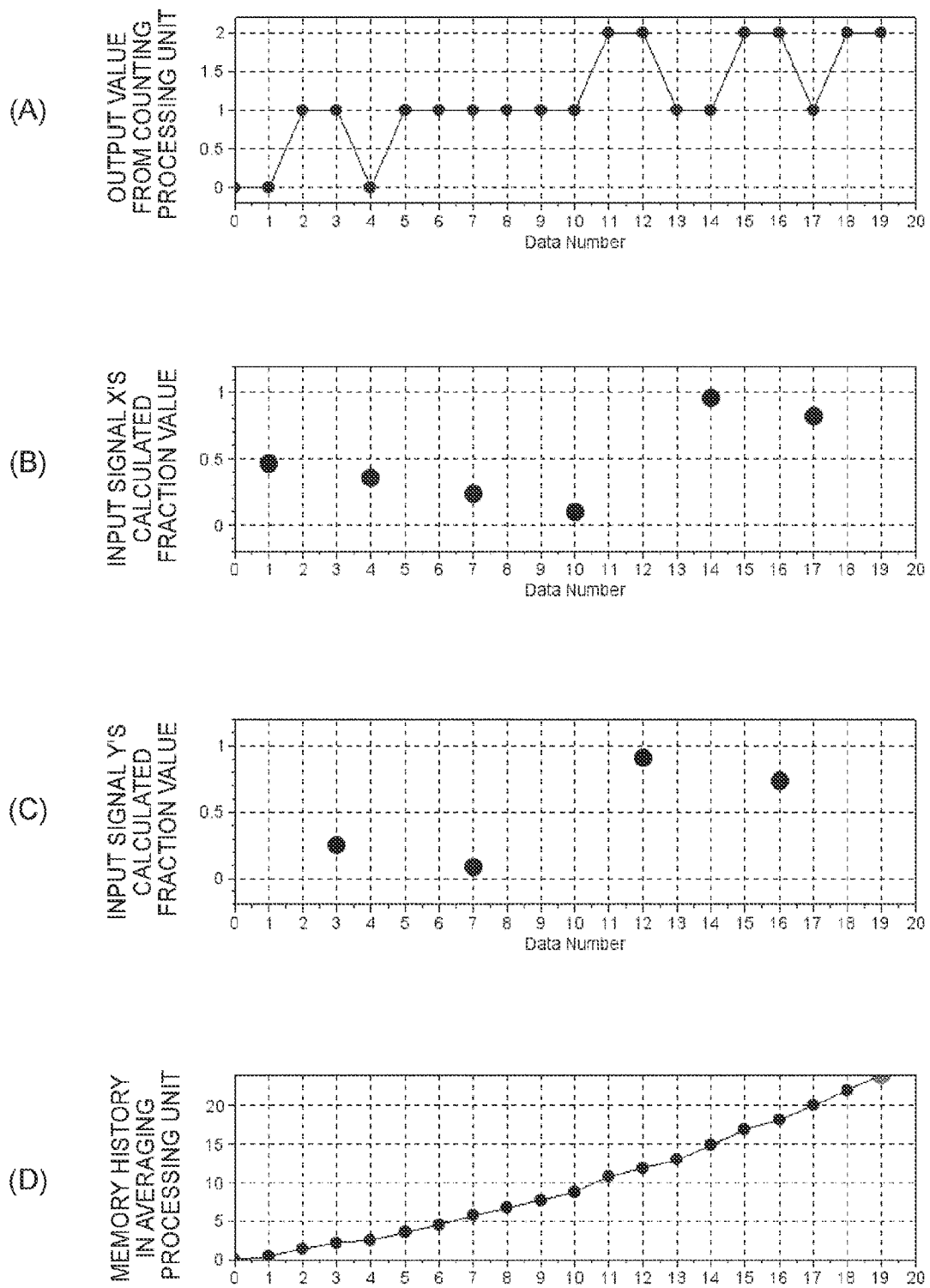
FIG. 13 is a diagram illustrating an operation until averaging processing is performed in the phase difference measuring device of the present invention.

$C_i$: an output value from the counting processing unit 4 (i.e. a value of the up-down counter; see FIG. 13 (A)).

$F_j^X$: a calculated fraction value, calculated for the input signal X by the fraction processing unit 5 (FIG. 13 (B)). Here, j is the number attached to indicate the order of each output value. In the example shown in FIG. 13 (B), six points are plotted over the data numbers from 0 to 19, so j=1-6. This means I=6 in the expression 6.

$F_k^Y$: a calculated fraction value, calculated for the input signal Y by the fraction processing unit 5 (FIG. 13 (C)). Here, k is the number attached to indicate the order of each output value. In the example shown in FIG. 13 (C), four points are plotted over the data numbers from 0 to 19, so k=1-4. This means m=4 in the expression 6.

As explained above, in the example in FIG. 13, the addition, subtraction, and division by N, indicated by the expression 6, are performed with 20 pieces of $C_i$, 6 pieces of $F_j^X$, and 4 pieces of $F_k^Y$, to obtain an output value U from the averaging processing unit 6.

In the case where the above-described averaging processing is actually implemented in an FPGA, in order to ensure real-time performance, the processing may be performed in the following manner.

(1) At the timing corresponding to each data number, data pieces of $C_i$, $F_j^X$, $F_k^Y$ output from the counting processing unit 4 and the fraction processing unit 5 are transmitted to the averaging processing unit 6.

(2) The averaging processing unit 6 holds a value in its memory (with the initial value being zero), and at each timing, it adds/subtracts the received data to/from the value held in the memory, and holds the resultant value until the next data reception timing. That is, a value $S_i$ held in the memory is according to the following recurrence formula.

$$S_i = S_{i-1} + C_i + F^X - F^Y$$ (Expression 7)

It should be noted that $F^X$ and $F^Y$ are used in the computation only when the values have been transmitted. At this time, the history of $S_i$ is as shown in FIG. 13 (D).

(3) Here, in the fraction processing unit 5, the calculated fraction value is associated with the timing immediately before the zero-crossing detection timing, as explained above. The calculated fraction value can be obtained only after the zero-crossing detection timing, so the timing needs to be adjusted.

To this end, a delay for M timings may be inserted before the addition/subtraction is performed in the averaging processing unit 6. M is an appropriate integer not smaller than 1 and sufficiently smaller than N.

With the delay inserted, the processing in (2) above can be performed after the calculation of the calculated fraction values $F_j^X$, $F_k^Y$, at the expense of the delay for M timings of the value held in the memory.

The time delay for M timings, however, poses no problem because it is sufficiently smaller than the above-described sampling rate at which the output data will be obtained ultimately.

The time delay of course takes a known fixed value constantly. It is thus possible to compensate for the delay when accuracy in measurement time is desired, as in the case of measuring the phase itself as explained earlier.

(4) The addition/subtraction is repeated as in (2) above.

(5) With the processing in (4) continued, once the last data has been received, the value held at the time point corresponding to i=19 (last) is divided by N to obtain the value in the expression 6. Therefore, this value may be used as the ultimate output. After completion of this series of operations, the value held is reset to zero before starting the next series of operations.

Further, in the case where it is necessary to reduce the load of the division part of dividing with N, a power of two may be selected as N.

The output U from the averaging processing unit and a desired phase difference have a relationship expressed by the following expression 8.

$$\Delta\phi = \pi U$$ (Expression 8)

More precisely, a constant ε is added to the right side of the expression 8. Theoretically, ε is a value that takes a value of π, −π, or zero, which is uniformly determined in accordance with the phase relationship of the input signals at the start of measurement. In the case where phase difference measurement is performed successively, as in the present invention or in an apparatus using the same, the change in phase difference becomes a major parameter to be measured, so ε is a term that is ignorable and poses no problem on the measurement. That is, when the value of U calculated firstly after the start of measurement is represented as $U_0$ and the subsequent value of U is represented as Un (n=1, 2, . . . ), $Un-U_0$ is used as a measurement result. Thus, the presence of ε, which is added to both, poses no problem.

Here, Δϕ is a phase difference (in radian) between the input signal X and the input signal Y. The phase difference is measured with respect to the time point when the processing was started. When the output U is processed inside the FPGA or on the PC on the basis of this relationship, the phase difference (in radian) can be calculated.

In consideration of the processing in subsequent stages, it is of course possible to use the data U, as it is, in the processing in the subsequent stages, without converting it into a phase difference (in radian) as in the expression 8.

A measurement instrument that computes and outputs a result in real time is required to have a function of setting a time as a basis for starting measurement. That is, it is desired to have a function of setting a phase difference Δϕ to zero at the time when a certain reset signal has been received during the operation, and computing the subsequent output data on the basis of that reference time. This function can readily be implemented by an operation of resetting the value of the up-down counter in the counting processing unit to zero and initializing the processing in the averaging processing unit at the timing of reception of a reset signal.

Calculating a phase difference according to the processing as described above makes it possible to input two periodical signals in a wide frequency range, and to perform measurement with accuracy and in real time.

While the example of implementing the digital signal processing by an FPGA has been illustrated above, not only the FPGA, but also an ASIC, a system LSI, or any other method capable of realizing digital signal processing can implement the processing in a similar manner.

Further, while the input signals X and Y have both been assumed to be a sine wave signal, a pulse signal (also called a square wave signal) used in digital circuits can be converted into a sine wave signal by applying a band-pass filter or low-pass filter.

It is therefore possible to compose a phase difference measuring device for a pulse signal by disposing a band-pass filter in a stage preceding the phase difference measuring device.

It should be noted that the present phase difference measuring device can readily be implemented by preparing two phase measuring devices and causing them to operate in parallel. That is, when the processing result by a phase measuring device 1 on an input signal X is represented as Ux and the processing result by a phase measuring device 2 on an input signal Y is represented as Uy, the phase difference can be calculated by Δϕ=π(Ux−Uy). Theoretically, the phase difference measurement result obtained in this manner is precisely the same as the result obtained by the present phase difference measuring device, so both yield the same advantageous effects.

EXAMPLES

Examples of applications to specific apparatuses will now be described.

[Example 1] (Application to Laser Heterodyne Displacement Measuring Device)

In this example, the phase difference measuring device 10 of the present invention based on the above-described basic principles is applied to a laser heterodyne displacement measuring device. The present example will be described below, with a reference signal as the input signal X and a measurement signal as the input signal Y.

A laser heterodyne interferometer has widely been known as a measuring device utilizing the phase difference of laser light. In the laser heterodyne interferometer, laser light subjected to frequency shifting is used, and a phase difference between reflected light of the laser light from a measurement object and reference light is used to measure, for example, a displacement, or a displacement that occurs when vibration or shock is applied.

FIG. 14 shows the basic principles of a laser heterodyne interferometer.

In a displacement measuring device based on the laser heterodyne interferometer, a reference signal having a frequency of 80 MHz, for example, is input into a device, such as an AOM, that applies a frequency shift to laser light, and the resultant laser light frequency-shifted by 80 MHz is interfered with the laser light reflected from a measurement object, whereby a measurement signal is generated which has a phase modulation by a displacement of the measurement object added to 80 MHz.

In order to calculate the displacement from the two signals of the measurement signal and the reference signal, the phase difference measuring device 10 according to the present invention is applied to compose the laser heterodyne displacement measuring device.

Specifically, two sine wave input signals of the measurement signal and the reference signal are input into the phase difference measuring device 10 according to the present invention, to obtain output data U.

Here, the data U obtained in the averaging processing unit 6 and the displacement (d [m]) of the measurement object have a relationship as expressed by the expression 9, where X is a laser wavelength ([m]).

$$d=\lambda U/4 \qquad \text{(Expression 9)}$$

When the output U is processed inside the FPGA or on the PC on the basis of this relationship, the displacement can be calculated in real time.

Although in the present example the reference signal as the input signal X is assumed to be the AOM driving signal and the measurement signal as the input signal Y is assumed to be the optical interference signal as shown in FIG. 14, there may be laser heterodyne interferometers of various other configurations. In general, however, they are based on the same principle that the phase difference measuring device 10 according to the present invention is used inside the laser heterodyne interferometers.

Therefore, irrespective of the illustration in FIG. 14, the phase difference measuring device portion inside the laser heterodyne interferometer can be replaced with the phase difference measuring device 10 according to the present invention, to obtain similar advantageous effects as in the present embodiment.

The phase difference measuring device according to the present invention has two merits of being high in accuracy and being capable of measurement even when the phase difference varies considerably. These merits correspond respectively to "measurement resolution" and "velocity range of a measurement object" in displacement measurement. Thus, the specific example of the present example and the conventional techniques will be compared in these two respects.

Firstly, parameters necessary for analysis are defined as follows.

(1) $f_h$: a heterodyne beat frequency, which corresponds to the frequency of the reference signal in FIG. 14. In this example, it is set to 80 MHz.

(2) $f_{ADC}$: a sampling rate for driving the A/D converter. In this example, it is set to 500 MHz.

(3) $f_s$: a measurement sampling rate of the displacement data desired to be obtained. In this example, with N=20, $f_s$=500/N=25 MHz.

It should be noted that in a general laser heterodyne displacement meter, the measurement sampling rate is normally within the range of 1 kHz to 1 MHz.

(4) $V_{max}$: a maximum measurable velocity [m/s] of a measurement object.

(5) $d_r$: measurement resolution [m].

(6) λ: a laser wavelength. In this example, it is set to 633 nm, which is the wavelength of a helium-neon laser often used for a displacement measuring instrument. It is of course possible to apply various other lasers.

Firstly, a conventional counting method, having a merit that it is adaptable even when the velocity range of a measurement object is high, will be compared with the present example in terms of measurement resolution.

The conventional counting method can measure only an integer value of the number of times of zero-crossing of the input signal (measurement signal, reference signal). Thus, in order to improve the resolution, a technique of multiplying the input signal using a PLL circuit or the like, a technique of averaging the values calculated in a plurality of times, or other technique is often adopted. At this time, the measurement resolution can be expressed by the following expression 10.

$$d_r=\lambda/4LQ \quad \text{(Expression 10)}$$

Here, L is the multiplication rate by the PLL circuit, and Q is the number of averaging. In the commercially available products, LQ of at most about 1024 has been realized to achieve $d_r=\lambda/4096$=about 0.155 nm.

This technique, however, requires a high-speed PLL circuit or the like, and suffers increased technical difficulty, so it is difficult to increase L. Although it may be conceivable to increase the number Q of averaging, in principle, Q is limited to at most about 2fh/fs, with no further prospect of improvement.

By comparison, according to the present example, it is possible to obtain the measurement resolution that is much higher than $d_r=\lambda/4096$, the highest level of commercially available products, without using any PLL circuit.

That is, typically, the resolution can be expressed by the following expression 11.

$$d_r=\lambda/(4N\cdot 2^n) \quad \text{(Expression 11)}$$

Here, n is the number of conversion bits of the A/D converter. Assuming that n=8 bits, the present example achieves $d_r$=0.03 nm, with the number N of averaging being 20.

Assuming that $f_s$=1 MHz, which has widely been used, with N=500, the following holds:

$d_r$=0.0012 nm

This shows that the resolution obtained in the present example is better in the order of a hundredfold as compared to the resolution of about 0.155 nm by the counting method based on the conventional technique.

Next, a conventional demodulation method, which is good in measurement resolution, will be compared with the present example in terms of the velocity range of a measurement object.

In the demodulation method, it is necessary to adopt a low-pass filter that sets a frequency not greater than a half of the measurement sampling rate as a cut-off frequency $f_c$ according to the "sampling theorem" in the information theory. That is, it is necessary to satisfy the following expression 12.

$$f_c<f_s/2 \quad \text{(Expression 12)}$$

Here, the cut-off frequency $f_c$ restricts the maximum measurable velocity, by the following expression 13.

$$(2v_{max})/\lambda=f_c \quad \text{(Expression 13)}$$

From the above, the following expression 14 is derived.

$$v_{max}=(\lambda f_s)/4 \quad \text{(Expression 14)}$$

While a relatively high value of $f_s$=1 MHz is now being adopted as the measurement sampling rate, it still places a limit of $v_{max}$=about 0.16 m/s.

On the other hand, as to the velocity range of a measurement object according to the present example, an input signal having a frequency not greater than a half of the A/D converter sampling rate is measurable according to the sampling theorem. That is, the relationship between $f_{ADC}$ and $v_{max}$ is expressed by the following expression 15.

$$f_{ADC}=2(2f_h+4v_{max}/\lambda) \quad \text{(Expression 15)}$$

Transposition yields the following.

$$v_{max}=\lambda(f_{ADC}-4f_h)/8 \quad \text{(Expression 16)}$$

Substituting the values now being used by way of example in the expression yields $v_{max}$=14.2 m/s.

Comparison of this value with the velocity range $v_{max}$=about 0.16 m/s in the demodulation method shows that the value obtained in Example 1 is greater in the order of a hundredfold.

The comparison with the conventional techniques will now be made in various respects other than the resolution and velocity range.

Firstly, in the method according to the present invention, real-time processing is possible even on a high-speed input signal. On the other hand, in the zero-crossing analysis method, the zero-crossing time of a signal is calculated from digitized data. This requires complicated calculations to be applied to the data temporarily held in a memory. Accordingly, it is not possible to perform real-time processing on a high-speed signal of 80 MHz, for example, as in the present example.

Further, in terms of tolerance to amplitude variation, the present invention is as strong as the counting method. On the other hand, the demodulation method is poor in this respect. Specifically, the method is undesirable because the output is sensitive when the signal amplitude varies, when the signal has been biased, when the signal has suffered distortion, etc.

The advantages of Example 1 as compared to the conventional techniques (demodulation method, counting method, zero-crossing method) as described above, from the standpoints of measurement resolution, velocity range of measurement object, capability of real-time processing, required clock speed, processing complexity, and tolerance to amplitude variation of signal, are listed in FIG. 15.

As such, while the conventional techniques each have disadvantages in certain perspectives, according to the present example, the requirements can be fulfilled in every respect.

In the case where a velocity signal of a measurement object is desired to be obtained, as in a laser Doppler vibrometer, it can readily be calculated by subjecting the displacement signal measured by the laser heterodyne displacement measuring device to temporal differentiation.

[Example 2] (Application to Phase Noise Measuring Device)

A phase noise measuring device is a device that measures a time history of phase fluctuation (noise) of a certain signal. The phase fluctuation is also called phase jitter, which is an important index for evaluating the stability of a high-frequency signal source. The phase noise measuring device is therefore an instrument indispensable to research and development on faster communication equipment and others.

In order to implement a phase noise measuring device by applying the present invention thereto, a measured signal may be used as the input signal in FIG. 1. In this case, the measurement performance of phase noise (self-noise of the phase noise measuring device itself) is determined according to the phase noise level of the A/D converter driving clock. Thus, when measurement with lower noise is desired, a high-stability reference signal may be introduced to the driving clock.

Alternatively, a measured signal and a high-stability reference signal may be input as the input signal X and the input signal Y, respectively, to the phase difference measuring device in FIG. 8. In this case, the phase noise of the measured signal can be measured without being affected by the phase noise level of the A/D converter driving clock.

Figure 16:
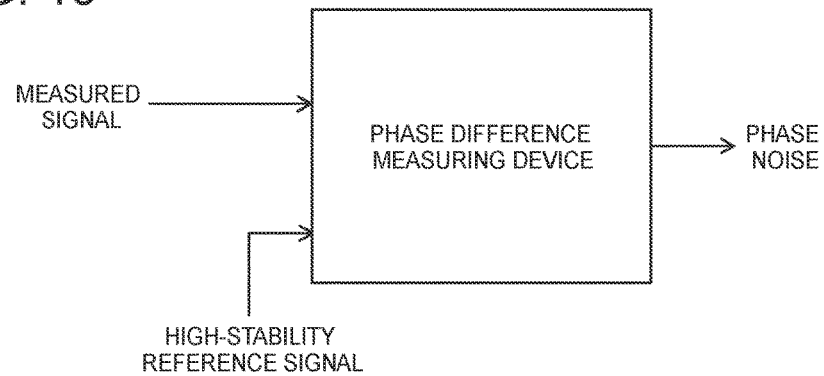
FIG. 16 is a diagram illustrating a general outline of Example 2 as an application to a phase noise measuring device.

FIG. 16 illustrates the application. Here, the high-stability reference signal refers to a periodical signal having extremely small phase noise, which signal can become the basis of measurement. It can be obtained by an atomic clock, for example.

While the measured signal and the high-stability reference signal have been set as the input signals X and Y, respectively, they may be set conversely as the input signals Y and X.

Applying the present invention makes the measurement possible even in the case where the measured signal and the high-stability reference signal considerably differ in frequency. Specifically, when the frequency of a measured signal is represented as $f_A$ and the sampling rate for driving the A/D converter as $f_{ADC}$, measurement becomes possible in the range of $f_A < f_{ADC}/4$, and at the same time, the resolution of the phase noise measurement can be increased.

That is, when the number of conversion bits of the A/D converter is represented as n (for example, n=8 bits), the number of averaging as N, and the resolution of the phase noise as d (in radian), the following relationship holds: $d = 2\pi/(N \cdot 2^n)$.

Further, according to the present invention, highly reliable measurement is possible even in the case where the phase noise level of the measured signal is very large, i.e. when the phase variation exceeds $2\pi$ to a large extent, for example.

Specifically, the phase noise measuring devices according to the existing techniques include:

(A) those of highly accurate type, using a spectrum analyzer and PLL; and (B) those of wide range type, performing A/D conversion and analysis as in an oscilloscope.

With (A), any signal having too large phase noise will become out of range, so the measurement thereof is impossible. On the other hand, according to the present technique, there is no problem because of the wide frequency range of the measured signal. With (B), while measurement is possible even for a signal having large phase noise, the memory capacity is limited, so the measurement becomes impossible in an area with low offset frequency where long-time data acquisition is necessary. The present technique supports real-time processing, thereby enabling highly reliable measurement even in the area where the offset frequency is extremely low.

[Example 3] (Application to PLL Circuit)

Figure 17:
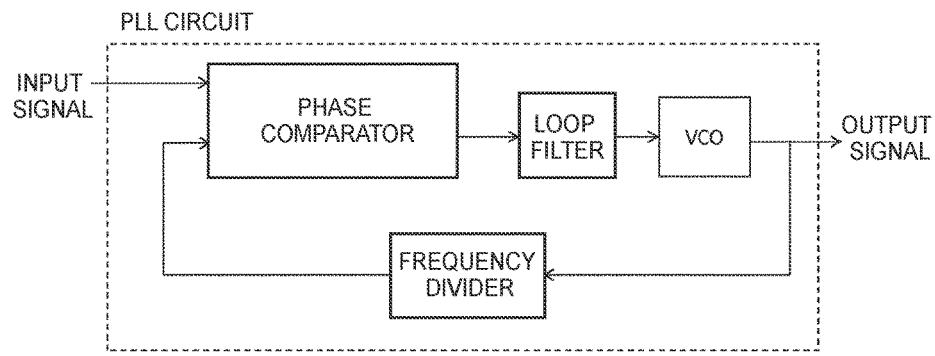
FIG. 17 is a block diagram of a general PLL circuit.

A PLL circuit, as shown in FIG. 17, is a circuit that generates a phase-locked output signal with respect to an input, periodical signal. In the circuit, feedback control as shown in FIG. 17 is performed by a phase comparator, a loop filter, a voltage-controlled oscillator (VCO), and a frequency divider.

In the present example, the portion of the phase comparator in this PLL circuit is replaced with the phase difference measuring device according to the present invention and a band-pass filter or low-pass filter.

Figure 18:
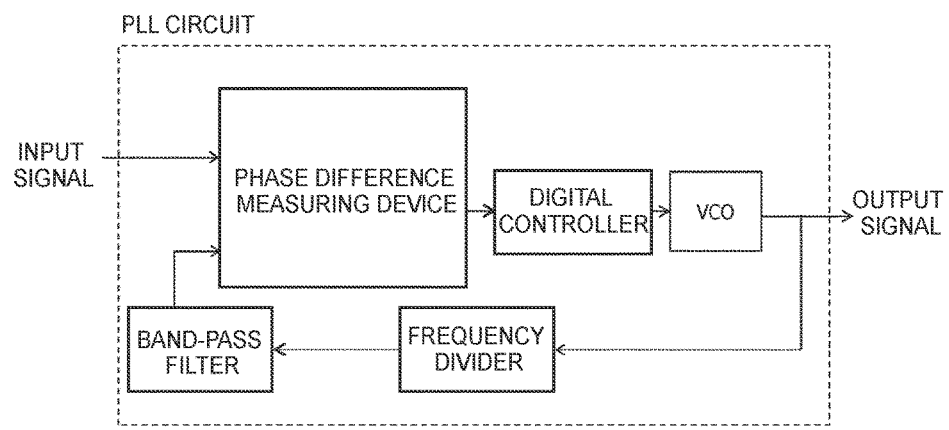
FIG. 18 is a block diagram of Example 3 as an application to a PLL circuit.

Specifically, the phase difference measuring device according to the present invention outputs a phase difference in the form of digital value, so the loop filter is replaced with a digital controller, as shown in FIG. 18.

In the case where an input signal is a pulse signal, a band-pass filter or a low-pass filter is inserted in front of the PLL circuit, although such a filter is unnecessary when the input signal is a sine wave or similar periodical signal.

Applying the present invention to the PLL circuit yields the following advantages.

Firstly, the circuit operates even when there is a large frequency difference between the input signal X and the input signal Y of the phase difference measuring device.

In a normal PLL circuit, when the variable frequency range of the VCO is represented as $\Delta f$ and the frequency dividing number as K, the range of the input signal kept under control of the PLL circuit is limited to $\Delta f/K$. In order to solve this problem, a complicated technique called a fractional PLL may be used to dynamically and meticulously change the frequency dividing number K.

On the other hand, in the case of the PLL circuit to which the present invention has been applied, when the frequency of the input signal is represented as $f_A$ and the sampling rate driving the A/D converter as $f_{ADC}$, measurement is possible in a much wider range of $f_A < f_{ADC}/4$.

Secondly, it is possible to introduce a digital technology for shortening the time (called a lock-up time) taken from when a desired frequency is set until when the phase control is completed.

In the conventional PLL, in order to shorten the lock-up time, the design of the loop filter would be modified to adjust the feedback control characteristics.

On the other hand, in the case of the PLL circuit to which the present invention has been applied, the digital controller is used in place of the loop filter, so it is possible, for example, to flexibly change the control characteristics, or to adopt a kind of feedforward technique called "gear shift".

It should be noted that the PLL circuit in the present example can be used as an FM demodulator, as in the case of a normal PLL circuit.

This is advantageous in that, with the advantageous effects of the present invention, the circuit operates even in the case where the frequency difference between the FM signal and the reference signal is large. Specifically, when the frequency of the measured signal is represented as $f_A$ and the sampling rate driving the A/D converter as $f_{ADC}$, measurement is possible in the range of $f_A < f_{ADC}/4$. It is thus possible to configure an FM demodulator capable of direct demodulation even if the transition amount of frequency hopping of the FM signal is considerably large, without the need to do phase lock again.

While the case of applying the present invention to a digital PLL circuit has been illustrated in the present example, there is another kind of PLL circuit called a full digital PLL. Such a full digital PLL also includes a phase comparator, so the present invention is applicable thereto in a similar manner as in the present example.

INDUSTRIAL APPLICABILITY

As described above, the present invention, with a simple circuit configuration, allows input of periodical signals of a wide frequency range, and also enables measurement of a phase or a phase difference with accuracy, at equal time intervals, and in real time. Accordingly, it can be expected to be applicable to a laser heterodyne displacement measuring device, a phase noise measuring device, a PLL circuit, and various other apparatuses.

REFERENCE SIGNS LIST

1: phase measuring device
2: first A/D converter
3: driving clock
4: counting processing unit
5: fraction processing unit
6: averaging processing unit
10: phase difference measuring device
30: second A/D converter
41: first zero-crossing identification means
42: second zero-crossing identification means
43: counter
44: up-down counter

What is claimed is:

1. A phase measuring device for measuring a phase of a periodical input signal that changes periodically or a phase difference between periodical input signals by using a digital circuit, the device comprising:
an A/D converter that digitizes the periodical input signal respectively at each predetermined sampling timing and outputs each resultant signal as a digital signal;
a zero-crossing identification means operable to detect a change in sign of the digital signal;
a counting processing unit that counts the number of times of zero-crossing detection by the zero-crossing identification means and calculates the number at each said sampling timing;
a fraction processing unit that computes a fraction $F^x$ of the number of times of zero-crossing detection, on the basis of the digital signal at sampling timings immediately before and immediately after determination of zero-crossing by the zero-crossing identification means; and
an averaging processing unit that performs averaging on the basis of a sum of N output values calculated by the counting processing unit and a sum of the fractions $F^x$ computed by the fraction processing unit during a corresponding period, to compute a phase of the digital signal.

2. The phase measuring device according to claim 1, wherein
the periodical input signal includes a first periodical input signal X and a second periodical input signal Y,
the A/D converter includes first and second A/D converters that digitize the periodical input signals X and Y, respectively, at each predetermined sampling timing and output the resultant signals as digital signals Xd and Yd, respectively,
the zero-crossing identification means includes first and second zero-crossing identification means operable to detect changes in sign of the digital signals Xd and Yd, respectively,
the counting processing unit counts a difference between the number of times of zero-crossing detection by the first zero-crossing identification means and the number of times of zero-crossing detection by the second zero-crossing identification means, and calculates the difference at each said sampling timing,
the fraction processing unit computes fractions $F^X$ and $F^Y$ of the respective numbers of times of zero-crossing detection by the first and second zero-crossing identification means, on the basis of the digital signals Xd and Yd at sampling timings immediately before and immediately after determination of zero-crossing by the corresponding ones of the first and second zero-crossing identification means, and
the averaging processing unit performs averaging on the basis of a sum of N output values calculated by the counting processing unit and a difference between a sum of the fractions $F^X$ and a sum of the fractions $F^Y$ computed by the fraction processing unit during a corresponding period, to compute a phase difference between the digital signals Xd and Yd, thereby measuring a phase difference between the periodical input signals X and Y.

3. The phase measuring device according to claim 1, wherein when a sampling rate for driving the A/D converter is represented as $f_{ADC}$ and the number of averaging of the averaging processing unit is represented as N, a phase difference calculation rate of $f_{ADC}/N$ is attained in the averaging processing unit.

4. A displacement measuring device based on a laser heterodyne interferometer, the device causing reflected light, obtained by irradiating a measurement object with laser light, to interfere with reference light, obtained by applying a frequency shift to the laser light, and measuring a displacement of the measurement object from a phase difference between the lights,
the device employing the phase measuring device according to claim 2, wherein
the reflected light corresponds to the first periodical input signal X and the reference light corresponds to the second periodical input signal Y, and
the phase measuring device includes a computing means that computes the displacement of the measurement object on the basis of an output from the averaging processing unit.

5. The displacement measuring device according to claim 4, wherein when resolution of the displacement measuring device is represented as $d_r$ and a maximum value of a measurable velocity range is represented as $v_{max}$, the following relationships are satisfied:

$$d_r = \lambda/(4N \cdot 2^n)$$

$$v_{max} < \lambda(f_{ADC} - 4f_h)/8$$

where $\lambda$ is a laser wavelength, N is the number of averaging, n is the number of conversion bits of the A/D converter, $f_{ADC}$ is a sampling rate of the A/D converter, and $f_h$ is a frequency of the reference signal.

6. A phase noise measuring device which measures a time history of phase fluctuation of an input signal by comparing the input signal with a high-stability reference signal, the device employing the phase measuring device according to claim 2, wherein the input signal and the high-stability reference signal correspond respectively to one and the other of the first periodical input signal X and the second periodical input signal Y, and the phase fluctuation of the input signal is measured on the basis of an output from the averaging processing unit.

7. A PLL circuit which generates a phase-locked output signal with respect to a periodical input signal by using a phase comparator, a loop filter, a voltage-controlled oscillator (VCO), and a frequency divider, the PLL circuit employing the phase measuring device according to claim 2 as the phase comparator, wherein the input signal corresponds to the first periodical input signal X and an output from the frequency divider corresponds to the second periodical input signal Y.

* * * * *

UNITED STATES PATENT AND TRADEMARK OFFICE
CERTIFICATE OF CORRECTION

PATENT NO. : 10,270,633 B2  
APPLICATION NO. : 15/526586  
DATED : April 23, 2019  
INVENTOR(S) : Wataru Kokuyama Page 1 of 1

It is certified that error appears in the above-identified patent and that said Letters Patent is hereby corrected as shown below:

In the Specification

Column 9, Line 15, delete Expression 2, and insert $$-- U = \frac{1}{N}\left(\sum_{i=0}^{N-1} C_i + \sum_{j=1}^{l} F_j^X\right) \quad \text{(Expression 2)} --$$

Column 9, Line 35, delete "is, I=6 in the expression 2." and insert --is, 1=6 in the expression 2.--

Column 13, Line 45, delete Expression 6, and insert $$-- U = \frac{1}{N}\left(\sum_{i=0}^{N-1} C_i + \sum_{j=1}^{l} F_j^X - \sum_{k=1}^{m} F_k^Y\right) \quad \text{(Expression 6)} --$$

Column 13, Line 64, delete "j=1-6. This means I=6 in the expression 6." and insert --j=1-6. This means 1=6 in the expression 6.--

Signed and Sealed this  
Tenth Day of March, 2020

Andrei Iancu  
*Director of the United States Patent and Trademark Office*